(12) United States Patent
Theuss et al.

(10) Patent No.: US 9,653,405 B2
(45) Date of Patent: May 16, 2017

(54) CHIP ARRANGEMENT AND A METHOD OF MANUFACTURING A CHIP ARRANGEMENT

(71) Applicant: Infineon Technologies AG, Neubiberg (DE)

(72) Inventors: Horst Theuss, Wenzenbach (DE); Beng Keh See, Melaka (MY)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 13/771,222

(22) Filed: Feb. 20, 2013

(65) Prior Publication Data
US 2014/0231971 A1    Aug. 21, 2014

(51) Int. Cl.
*H01L 23/552* (2006.01)
*H01L 21/56* (2006.01)
*H01L 23/00* (2006.01)

(52) U.S. Cl.
CPC ............ *H01L 23/552* (2013.01); *H01L 21/56* (2013.01); *H01L 21/561* (2013.01); *H01L 24/97* (2013.01); *H01L 21/568* (2013.01); *H01L 2224/32245* (2013.01); *H01L 2224/48247* (2013.01); *H01L 2224/97* (2013.01); *H01L 2924/12042* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01)

(58) Field of Classification Search
CPC ....... H01L 21/56; H01L 21/561; H01L 24/18; H01L 24/82; H01L 24/97; H01L 2224/97; H01L 23/24; H01L 23/3114; H01L 23/3675; H01L 23/4334; H01L 23/49861; H01L 23/552; H01L 23/645
USPC .................. 257/659, 676, E23.031, E21.502; 438/112
See application file for complete search history.

(56) References Cited

U.S. PATENT DOCUMENTS

| | | | | |
|---|---|---|---|---|
| 5,386,141 A | * | 1/1995 | Liang | ................ H01L 23/49503 257/676 |
| 5,679,975 A | * | 10/1997 | Wyland et al. | ................ 257/659 |
| 8,199,518 B1 | * | 6/2012 | Chun | ................ H01L 23/49811 361/767 |

(Continued)

OTHER PUBLICATIONS

Weibler, Joseph, "Properties of metals used for RF shielding," Dec. 1993, EMC Test & Design.*

(Continued)

*Primary Examiner* — John P Dulka
*Assistant Examiner* — Christina Sylvia
(74) *Attorney, Agent, or Firm* — Viering, Jentschura & Partner mbB

(57) ABSTRACT

In various embodiments, a chip arrangement may be provided. The chip arrangement may include a metallic carrier. The chip arrangement may also include at least one chip arranged on the metallic carrier, wherein the at least one chip includes a chip contact, wherein the chip contact is electrically coupled to the metallic carrier. The chip arrangement may also include encapsulation material at least partially encapsulating the at least one chip. The chip arrangement may also include an electrically conductive shielding structure formed over at least a portion of the encapsulation material to electrically contact the metallic carrier.

13 Claims, 9 Drawing Sheets

(56) References Cited

U.S. PATENT DOCUMENTS

| | | |
|---|---|---|
| 2005/0067676 A1 | 3/2005 | Mahadevan et al. |
| 2006/0166397 A1* | 7/2006 | Lau ....................... H01L 21/561 |
| | | 438/106 |
| 2009/0001553 A1* | 1/2009 | Pahl et al. .................... 257/704 |
| 2009/0289335 A1* | 11/2009 | Camacho ............ H01L 23/3107 |
| | | 257/659 |
| 2009/0309174 A1* | 12/2009 | Fueldner ............... B81C 1/0023 |
| | | 257/416 |
| 2011/0198737 A1 | 8/2011 | Yao et al. |
| 2011/0241190 A1* | 10/2011 | Elian et al. .................... 257/676 |
| 2012/0126378 A1 | 5/2012 | San Antonio et al. |
| 2012/0241922 A1 | 9/2012 | Pagaila |

OTHER PUBLICATIONS

Amkor Technology, "Enabling Package Level Shielding", Amkor Conformal Shielding Overview; Jul. 2011; pp. 1-7.

* cited by examiner

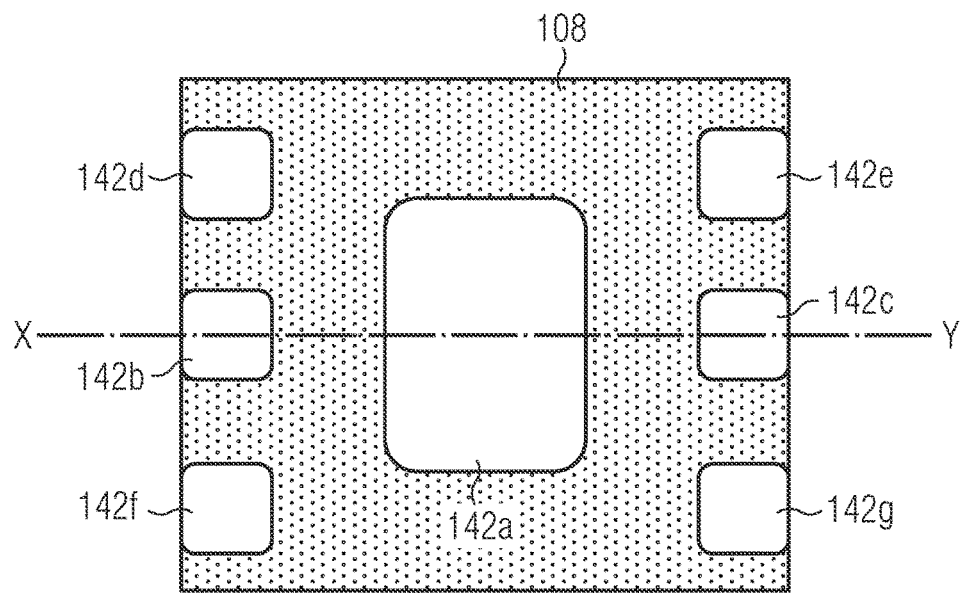

FIG. 2      200

Arranging at least one chip on a metallic carrier, wherein the at least one chip includes a chip contact ⸺ 202

Electrically coupling the chip contact to the metallic carrier ⸺ 204

At least partially encapsulating the at least one chip with encapsulation material to form an encapsulated structure ⸺ 206

Forming an electrically conductive shielding structure over at least a portion of the encapsulation material to electrically contact the metallic carrier ⸺ 208

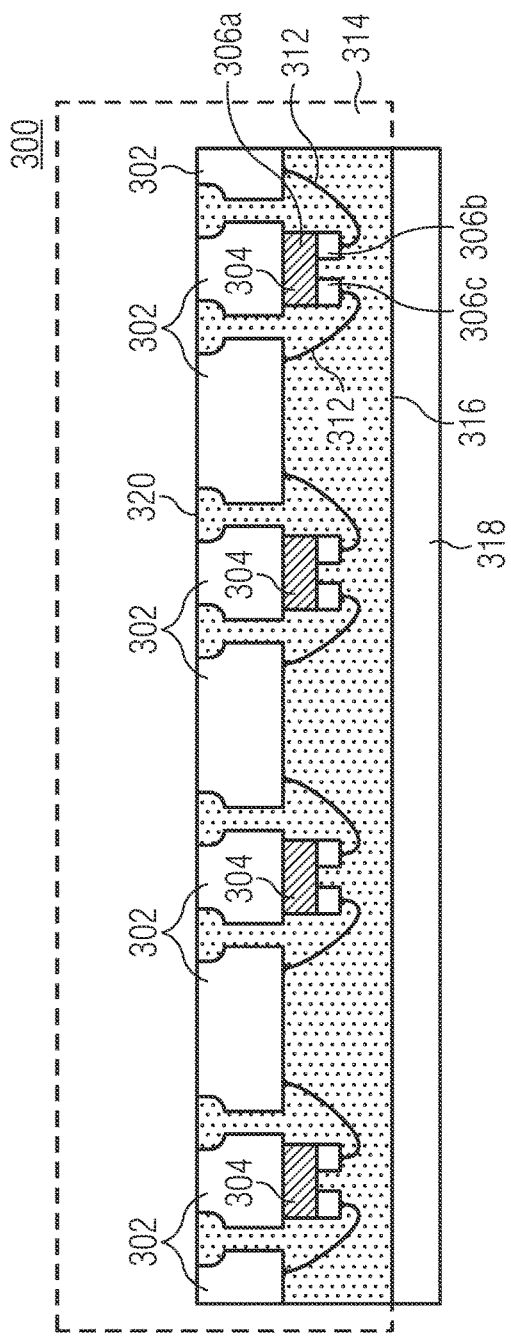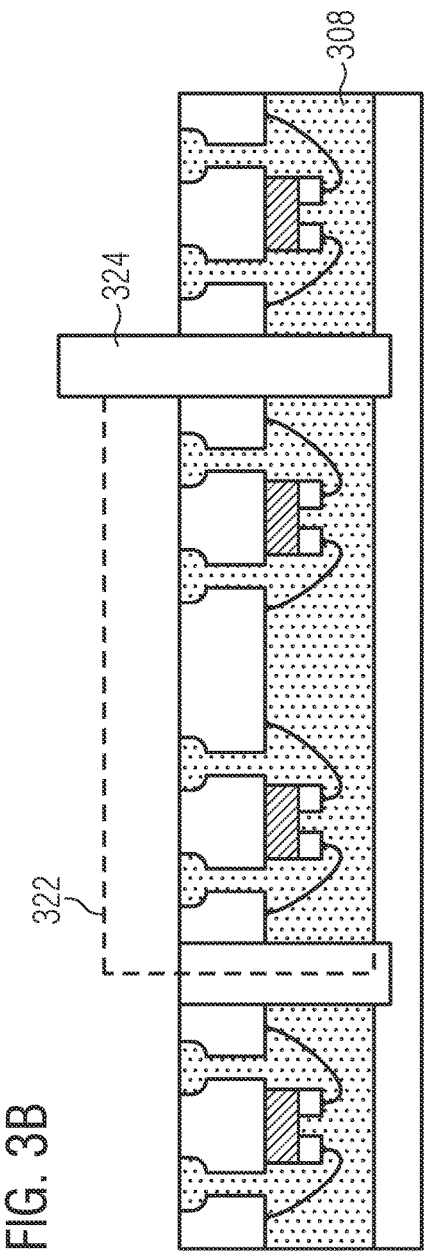

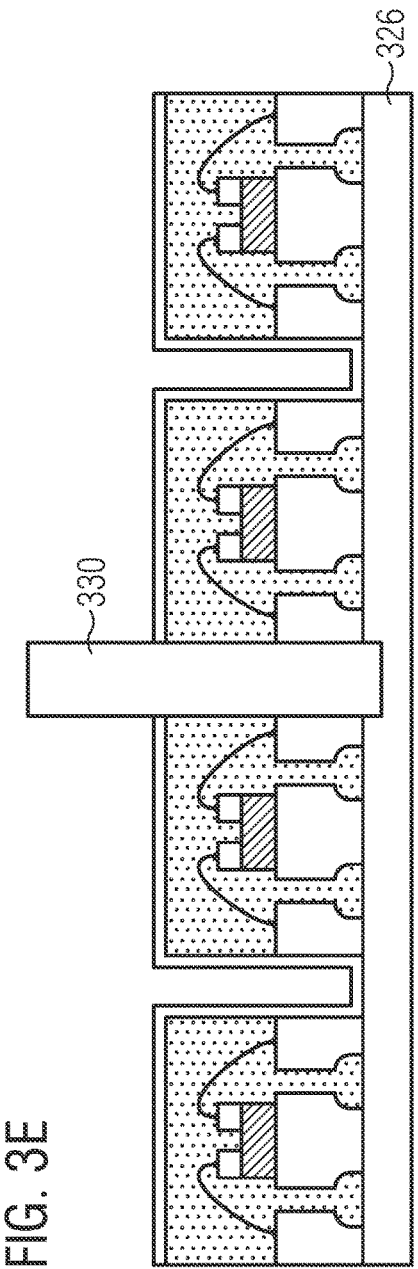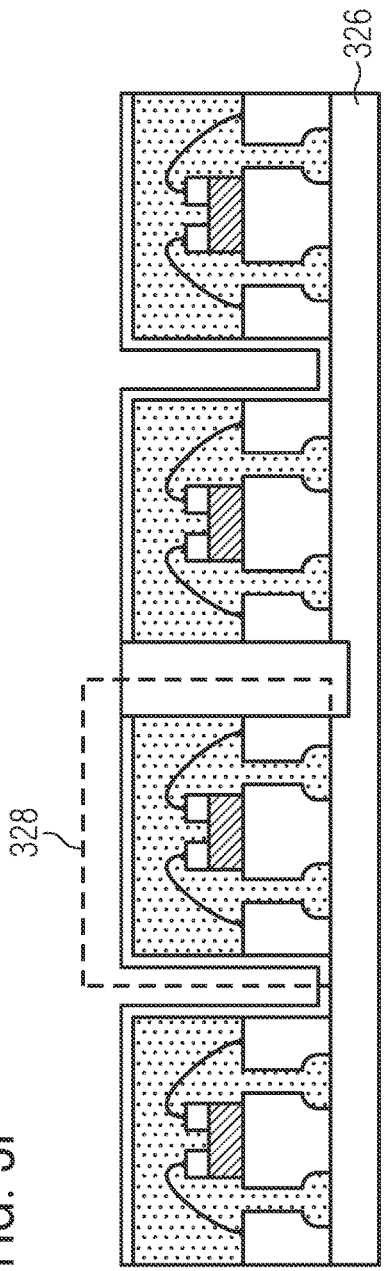

CHIP ARRANGEMENT AND A METHOD OF MANUFACTURING A CHIP ARRANGEMENT

TECHNICAL FIELD

Various embodiments relate generally to chip arrangements and methods of manufacturing chip arrangements.

BACKGROUND

Certain electrical devices are sensitive to electrical interferences such as electromagnetic radiation (commonly know as electrosmog). Electromagnetic radiation may arise from a variety of root causes, including from transmitters placed in the vicinity of the electrical device. In order to maintain their functionality and performance, these electrical devices need to be shielded from electromagnetic radiation.

Some devices have metal lids connected to a printed circuit board (PCB) or on individual chips. However, these are unsuitable for shielding individual semiconductor packages.

In addition, metal lids may be attached to chips prior to encapsulation. However, such a process is complicated. In addition, accurate positioning of the lids is difficult. The lids may also be expensive, which may increase manufacturing costs.

Using conductive encapsulation materials has also been proposed. However, such a solution requires electrical isolation of the mounted components (e.g. chips) prior to encapsulation in order to avoid short circuits. A suitable encapsulation material has not been found.

SUMMARY

In various embodiments, a chip arrangement may be provided. The chip arrangement may include a metallic carrier. The chip arrangement may also include at least one chip arranged on the metallic carrier, wherein the at least one chip includes a chip contact, wherein the chip contact is electrically coupled to the metallic carrier. The chip arrangement may also include encapsulation material at least partially encapsulating the at least one chip. The chip arrangement may also include an electrically conductive shielding structure formed over at least a portion of the encapsulation material to electrically contact the metallic carrier.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1A shows a cross-sectional side view of a chip arrangement according to various embodiments and FIG. 1B shows a bottom planar view of the chip arrangement according to various embodiments shown in FIG. 1A;

FIG. 2 shows a method for manufacturing a chip arrangement according to various embodiments FIG. 3, which includes FIGS. 3A-G, shows a method for manufacturing a chip arrangement according to various embodiments; wherein FIG. 3A shows an encapsulated structure held from a first main processing side by means of a first holding structure according to various embodiments; FIG. 3B shows the encapsulated structure being diced to form a plurality of diced encapsulated structures according to various embodiments; wherein FIG. 3C shows the plurality of diced encapsulated structures being held by a second holding structure according to various embodiments; wherein FIG. 3D shows the encapsulated structure with an electrically conductive shielding structure over at least a portion of the encapsulation material according to various embodiments; wherein FIG. 3E shows the encapsulated structure (or diced encapsulated structures) being diced according to various embodiments; wherein FIG. 3F shows a plurality of diced chip arrangements being held by means of the second holding structure according to various embodiments; and wherein FIG. 3G shows a plurality of separated diced chip arrangements according to various embodiments; and FIG. 4, which includes FIGS. 4A-D, shows a method for manufacturing a chip arrangement according to various embodiments; wherein FIG. 4A shows an encapsulated structure held from a second main processing side by means of a first holding structure according to various embodiments; wherein FIG. 4B shows the encapsulated structure being diced to form a plurality of diced encapsulated structures according to various embodiments; wherein FIG. 4C shows the encapsulated structure (or a plurality of diced encapsulated structures) with an electrically conductive shielding structure over at least a portion of the encapsulation material according to various embodiments; and wherein FIG. 4D shows the encapsulated structure (or diced encapsulated structures) being diced according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of this disclosure provide a chip arrangement and a method of manufacturing the same that is able to address at least partially some of the abovementioned challenges.

Figure 1A:
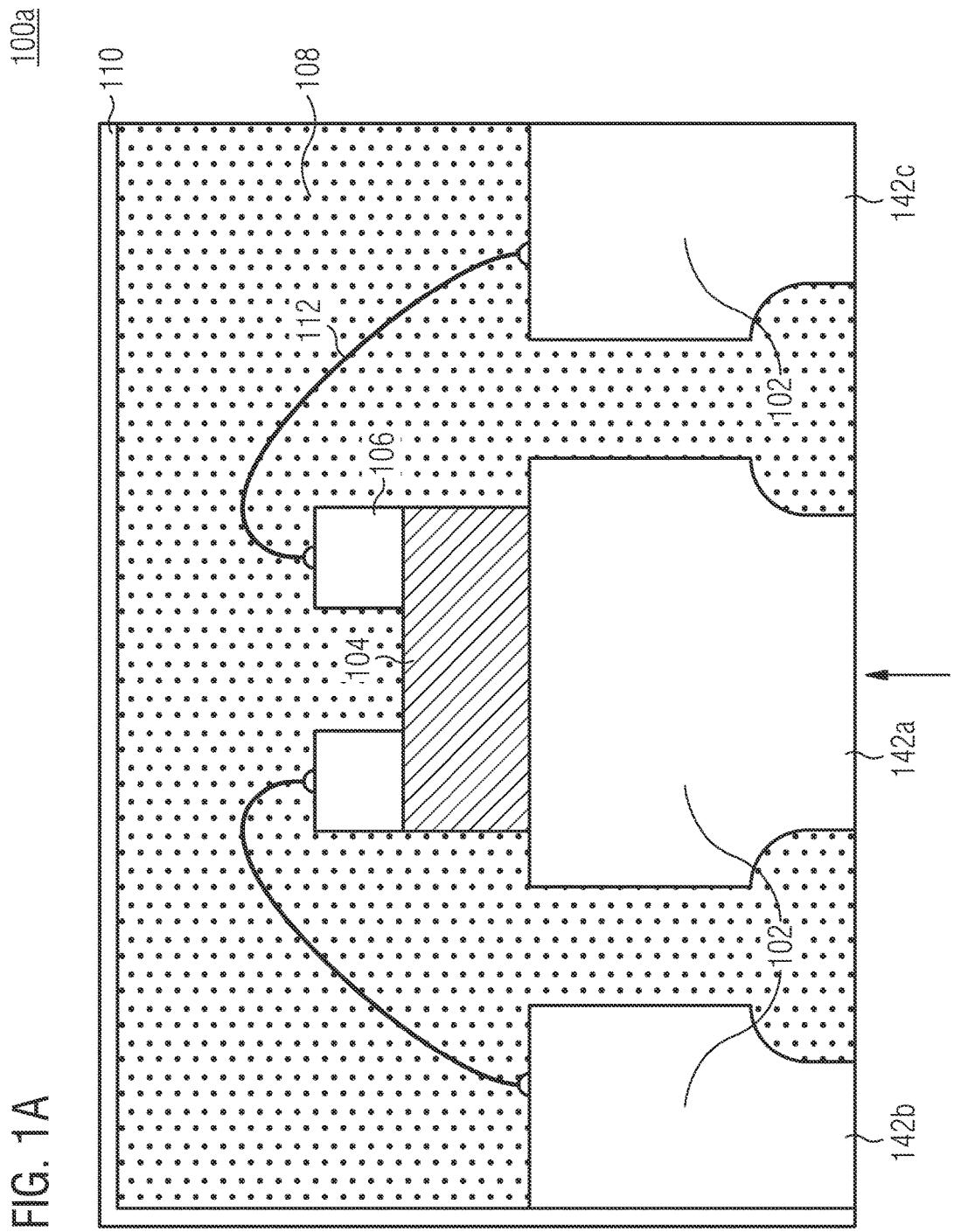

FIG. 1A is a schematic 100a showing a cross-sectional side view of a chip arrangement according to various embodiments. The chip arrangement may include a metallic carrier 102. The chip arrangement may also include at least one chip 104 arranged on the metallic carrier 102, wherein the at least one chip includes a chip contact 106, wherein the chip contact 106 is electrically coupled to the metallic carrier 102. The chip arrangement may also include encapsulation material 108 at least partially encapsulating the at least one chip 104. The chip arrangement may also include an electrically conductive shielding structure 110 formed over at least a portion of the encapsulation material 108 to electrically contact the metallic carrier 102.

In various embodiments the chip arrangement may include at least one metallic carrier 102. At least one chip 104 may be arranged on the metallic carrier 102. The at least one chip 104 may include one or more chip contacts 106. The one or more chip contacts 106 may be electrically coupled to the metallic carrier 102. The chip arrangement may further include encapsulation material 108 at least partially encapsulating the at least one chip 104. In various embodiments, at least a portion of the metallic carrier 102 may be free from the encapsulation material 108. An electrically conductive shielding structure 110 may be formed over at least a portion of the encapsulation material 108 to electrically contact the metallic carrier 102 via the portion of the metallic carrier 102 which is free from the encapsulation material 108.

Various embodiments may help to reduce electromagnetic radiation interference or damage to the chip(s) 104. Various embodiments may reduce interference from satellite-based systems (such as Global Positioning System (GPS)). Various embodiments may reduce interference from mobile phone antennas.

In various embodiments, the chip arrangement may be configured as a leadless package. The chip arrangement may be a chip package that includes conductive pads, the conductive pads configured to make electrical contact with a circuit board. In various embodiments, the chip arrangement may be configured as a quad flat no-lead (QFN) package. Furthermore, the chip arrangement may be configured as a dual flat no-lead (DFN) package. The chip arrangement may also be configured as an ultra thin quad flat no-lead (UTQFN) package. In various embodiments, the chip arrangement may be configured as an ultra thin dual flat no-lead package (UTDFN). In various embodiments, the chip arrangement may be configured as a thin quad flat no-lead (TQFN) package. In various embodiments, the chip arrangement may be configured as a thin dual flat no-lead (TDFN) package. In various embodiments, the chip arrangement may be configured as an extremely thin quad flat no-lead (XQFN) package. In various embodiments, the chip arrangement may be configured as an extremely thin dual flat no-lead (XDFN) package.

The chip arrangement may alternatively be configured as a Thin Small Leadless Package (TSLP), e.g. even a Thin Super Small Leadless Package (TSSLP). The chip package may also be configured as a Thin Small Non-leaded Package (TSNP).

In various embodiments, the metallic carrier 102 is configured to provide a reference potential. The metallic carrier 102 may be grounded or may be put on a different reference potential.

In various embodiments, the metallic carrier 102 may include a leadframe. A leadframe may be more easily singulated (e.g. by sawing or dicing) or drilled during manufacturing. The leadframe may be a pre-structured leadframe or a post-structured leadframe.

The metallic carrier 102 may include a metal. The metallic carrier 102 may include a metallic alloy (e.g. copper alloy). The metallic carrier 102 may include a metallic compound (e.g. alumina). The metallic carrier 102 may only include one or more materials selected from a group consisting of metals, metallic alloys and/or metallic compounds. In various embodiments, the metallic carrier 102 may be formed by means of stamping. The metallic carrier 102 may alternatively be formed by means of etching. The chip carrier 102 may be plated with a material for bonding with the chip 104. The material may be any of silver (Ag), lead (Pd) or gold (Au). In various embodiments, the chip carrier 102 may include a patterned chip carrier. In various embodiments, the chip carrier 102 may include a slotted chip carrier. In various embodiments, the chip carrier 102 may include a non-patterned chip carrier.

In various embodiments, the chip contact 106 may be electrically coupled to the metallic carrier 102 via a wire bond 112. In various embodiments, the chip contact 106 may be electrically coupled to the metallic carrier 102 via a redistribution layer. The chip contact 106 may also be directly electrically coupled to the metallic carrier 102.

In various embodiments, the electrically conductive shielding structure 110 may be formed over a first main surface of the encapsulation material 108 and a side wall of the encapsulation material 108. A main surface of the encapsulation material 108 may be taken as a surface of the encapsulation material 108 that is substantially parallel to the chip carrier 102. A side wall of the encapsulation material 108 may be taken as a surface of the encapsulation material 108 that extends from a first main surface of the encapsulation material 108 to a second main surface of the encapsulation material 108 opposite the first main surface.

In various embodiments, a second sidewall of the encapsulation material 108, which is opposite the first side wall of the encapsulation material 108 may be substantially free of the electrically conductive shielding structure 110.

In various embodiments, the electrically conductive shielding structure 110 may be formed to electrically contact the metallic carrier 102 via the first sidewall of the encapsulation material 108.

The at least one chip 104 may include a plurality of chips. More than one chip of the plurality of chips may form a stacked arrangement on the metallic carrier 102. The plurality of chips may alternatively or in addition be laterally arranged on the metallic carrier 102. The at least one chip (or plurality of chips) may be or include an application specific integrated circuit (ASIC) chip. The at least one chip (or plurality of chips) may be or include a logic chip. The at least one chip (or plurality of chips) may be or include a microcontroller chip. The at least one chip (or plurality of chips) may be or include a hard wired logic chip and/or a programmable logic chip (such as e.g. a programmable processor, e.g. a programmable microprocessor).

The plurality of chips may be configured to work with one another. In various embodiments, the plurality of chips may be different modules configured to work with one another. For instance, a first chip of the plurality of chips may be a filter, a second chip of the plurality of chips may be an amplifier such as a low noise amplifier etc.

In various embodiments, the chip may include further chip contacts. The further chip contacts may be electrically coupled to the metallic carrier 102. The further chip contacts may also be electrically coupled to another chip of the plurality of chips.

In various embodiments, at least one hole may be formed through the encapsulation material 108 to expose a portion of the metallic carrier 102. The electrically conductive shielding structure 110 may be formed over at least a portion of a sidewall of a hole through the encapsulation material 108 to electrically contact the exposed portion of the metallic carrier 102. The at least one hole may be formed using etching. Etching may be or include reactive ion etching. Etching may be or include deep reactive ion etching. The at least one hole may also be formed by drilling such as mechanical drilling or laser drilling. Forming of the electrically conductive shielding structure may include deposition (such as deposition by physical vapour deposition (sputtering), spraying, evaporation, plasma deposition etc.).

FIG. 1B is a schematic 100b showing a bottom planar view of the chip arrangement according to various embodiments shown in FIG. 1A. FIG. 1B corresponds to the view when viewed in the direction indicated by arrow in FIG. 1A. FIG. 1A corresponds to the cross-section indicated by dashed line XY in FIG. 1B. The chip carrier may include conductive pads 142a, 142b, 142c, 142d, 142e and 142f. The conductive pads may be metal pads. In various embodiments, the electrically conductive shielding structure 110 may be electrically coupled to the conductive pads in contact with the first sidewall of the encapsulation material 108, for instance conductive pads 142b, 142d and 142f. In various embodiments, conductive pads not in contact with the first side wall of the encapsulated material 108 such as 142a, 142c, 142e, 142f may be electrically insulated from the electrically conductive shielding structure 110.

FIG. 2 shows a schematic 200 of a method for manufacturing a chip arrangement according to various embodiments. The method may include, in 202, arranging at least one chip on a metallic carrier, wherein the at least one chip includes a chip contact. The method may further include, in 204, electrically coupling the chip contact to the metallic contact. In addition, the method may also include, in 206, at least partially encapsulating the at least one chip with encapsulation material. The method may also include, in 208, forming an electrically conductive shielding structure over at least a portion of the encapsulation material to electrically contact the metallic carrier.

Various embodiments may provide a cost efficient to form the electrically conductive shielding structure. Various embodiments may provide forming the electrically conductive shielding structure in one step. An elegant way to contact the electrically conductive shielding structure with the chip contact of the at least one chip may also be provided.

Arranging the at least one chip on the metallic carrier may include bonding. Arranging the at least one chip on the metallic carrier may include a solder process. Arranging the at least one chip on the metallic carrier may include using an adhesive.

The arranging at least one chip on the metallic carrier may include arranging a plurality of chips on the metallic carrier. Each chip may include a chip contact. The method may further include, after encapsulating the plurality of chips with encapsulation material to form an encapsulated structure and before forming the electrically conductive structure, holding the encapsulated structure from a first main processing side thereof being opposite the metallic carrier by means of a first holding structure. The method may further include dicing the encapsulated structure to form a plurality of diced encapsulated structures held by means of the first holding structure.

For TSLP, TSSLP or TSNP, dicing the encapsulated structure may include dicing through the encapsulation material. For TSLP, TSSLP or TSNP, forming at least one hole through the encapsulation structure may include forming a hole through the encapsulation material. For QFN, DFN, UTQFN, UTDFN, TQFN, XQFN or XDDN packages, dicing the encapsulated structure may include dicing through the encapsulation material and the metallic carrier. For QFN, DFN, UTQFN, UTDFN, TQFN, XQFN or XDDN packages, forming at least one hole through the encapsulation structure may include forming a hole through the encapsulation material and the metallic carrier.

The first holding structure may include a dicing foil. In various embodiments, the first holding structure is adhered to the encapsulation material. The method may include holding the encapsulated structure from a second processing side thereof being opposite to the first main processing side by means of a second holding structure. The method may further include removing the first holding structure. The first holding structure may be removed while the encapsulated structure is held by means of the second holding structure.

In various embodiments, the electrically conductive shielding structure over at least a portion of the encapsulation material may be formed while the encapsulated structure is held by means of the second holding structure. The second holding structure may include a dicing foil. The second holding structure may be adhered to the encapsulation material and the metallic carrier.

The method may further include dicing to form the plurality of diced chip arrangements held by means of the second holding structure. The method may further include after dicing to form the plurality of diced chip arrangements, removing the second holding structure.

The method may be carried out as an embedded wafer process.

In various embodiments, the metallic carrier may include a leadframe.

In various embodiments, the chip contact may be electrically coupled to the metallic carrier via a wire bond.

In various embodiments, the electrically conductive shielding structure may be formed over a first main surface of the encapsulation material and a first sidewall of the encapsulation material.

The chip arrangement may be formed as a leadless package.

In various embodiments, at least one hole may be formed through the encapsulation material to expose at least a portion of the metallic carrier. The electrically conductive shielding structure may be formed over at least a portion of a sidewall of the hold through the encapsulation material to electrically contact the exposed portion of the of the metallic carrier.

Figure 3C:
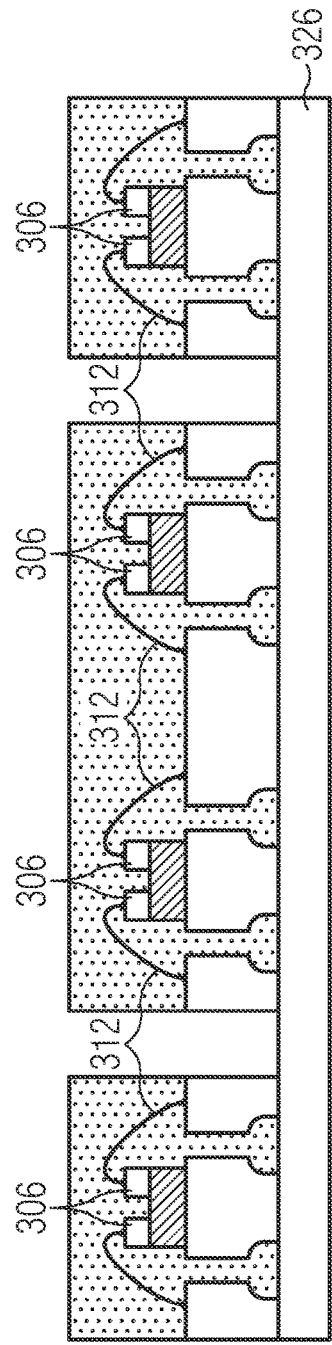
Figure 3D:
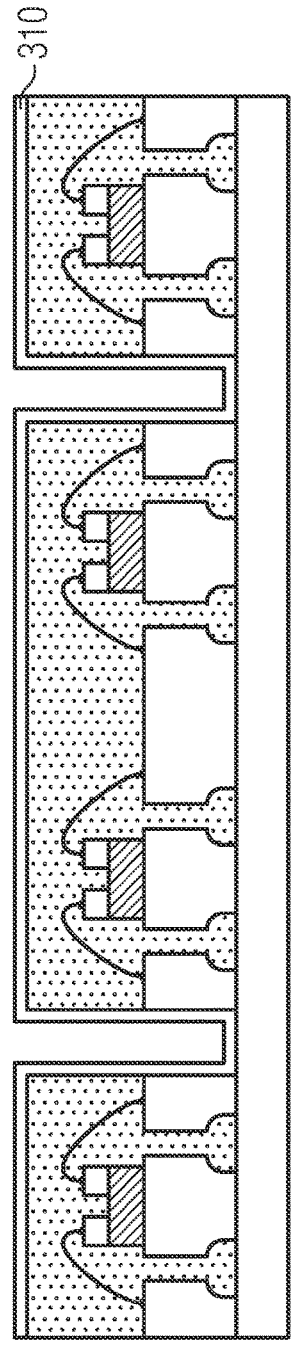
Figure 3G:
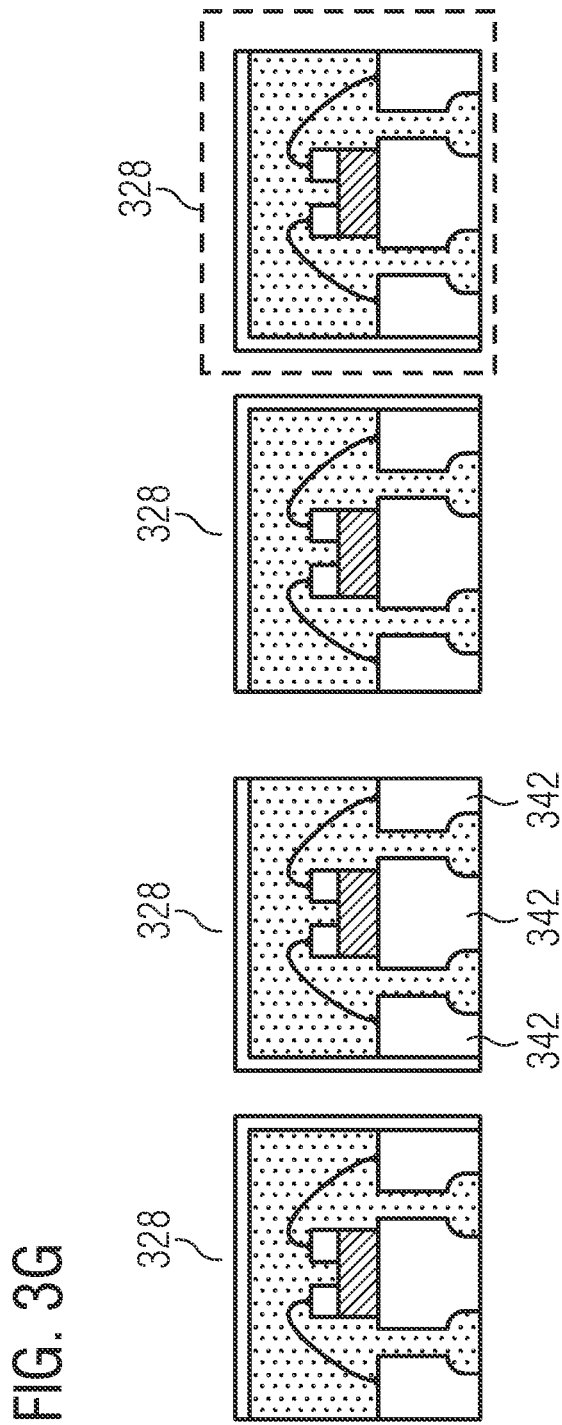

FIG. 3, which includes FIGS. 3A-G, shows a schematic 300 of a method for manufacturing a chip arrangement according to various embodiments. FIG. 3A shows an encapsulated structure 314 held from a first main processing side 316 by means of a first holding structure 318 according to various embodiments. The first holding structure 318 may include or be formed by a dicing foil. The first holding structure 318 may be adhered to the encapsulation material 308. Forming the encapsulated structure 314 may include one or more of diebonding, wirebonding and array molding. By way of example, the encapsulated structure 314 may be formed by means of embedded molding such as e.g. by means of embedded wafer level molding.

In various embodiments, the encapsulated structure 314 may include a plurality of chips 304 which may be arranged on a metallic carrier 302. The metallic carrier 302 may be a leadframe (the leadframe may be free of any leads (pins)). Each chip 304 may include one or more chip contacts 306a, 306b, 306c. A first chip contact 306a may be provided on a first main side of the chip 304 facing the metallic chip carrier 302 and a second chip contact 306b and a third chip contact 306c may be provided on a second main side of the chip 304 opposite the first main side and facing away from the metallic chip carrier 302. The chip 304 may include a power chip such as e.g. one or more transistors (e.g. one or more power semiconductor transistors (e.g. one or more field effect transistors (FETs) (e.g. metal oxide semiconductor FETs (MOSFETs)), one or more bipolar transistors and/or one or more insulated gate bipolar transistors (IGBTs)). The chip 304 may alternatively or in addition include logic circuitry, e.g. a driver circuit for the one or more power transistors). In case the chip includes or is formed by a MOSFET, the first chip contact 306a may be a drain contact, the second chip contact 306b may be a source contact and the third chip contact 306c may be a gate contact. In case the chip includes or is formed by a bipolar transistor or an IGBT, the first chip contact 306a may be a collector contact, the second chip contact 306b may be an emitter contact and the third chip contact 306c may be a base contact. The first chip contact 306a may be attached to the metallic chip carrier 302 and may be fixed thereto, e.g. by means of soldering.

Each chip contact 306a, 306b, 306c may be electrically coupled to the metallic carrier 302. The second chip contact 306b and the third chip contact 306c may be electrically coupled to the metallic chip carrier 302 via a wire bond 312. Arranging the plurality of chips 304 onto the metallic carrier 302 may include bonding. Arranging the plurality of chips 304 onto the metallic carrier 302 may include one or more solder processes, e.g. to solder the first chip contact 306a to the metallic carrier 302 and/or to solder the wire bonds 312 to the metallic carrier 302. Arranging the plurality of chips 304 onto the metallic carrier 302 may include using an adhesive, e.g. the first chip contact 306a may be adhered to the metallic carrier 302. The method may further include at least partially encapsulating the plurality of chips 304 with encapsulation material 308 to form an encapsulated structure 314.

The encapsulated structure 314 may have a first main processing side 316 opposite the metallic carrier 302. The encapsulated structure 314 may further have a second processing side 320 opposite the first processing side 316.

In other words, the encapsulated structure 314 may have a first main processing side 316 and a second main processing side 320. The chip carrier 302 may be adjoining the second main processing side 320. The chip carrier 302 may be exposed on the second main processing side 320. The first main processing side 316 is opposite of the second main processing side 320 on the encapsulated structure 314.

The encapsulated structure 314 may be held from the first main processing side 316 by means of a first holding structure 318. The first holding structure 318 may include a dicing foil. The first holding structure 318 may be adhered to the encapsulation structure 314.

FIG. 3B shows the encapsulated structure 314 being diced to form a plurality of diced encapsulated structures 322 according to various embodiments. The method may further include dicing the encapsulated structure 314 to form a plurality of diced encapsulated structures 322 held by means of the first holding structure 318. Dicing may include any of cutting, sawing, drilling (e.g. laser or mechanical) and/or blade dicing. Blade dicing made by carried out using a blade 324. Dice trenches separating each of the diced encapsulated structures 322 from one another may be formed by dicing. A plurality of holes may also be drilled (using, for instance, laser or mechanical drilling) into the encapsulated structure 314. Each hole may be formed through the encapsulation material to expose at least a portion of the metallic carrier 302. Forming a plurality of diced encapsulated structures 322 includes drilling a plurality of holes to form the plurality of diced encapsulated structures 322. In various embodiments, each diced encapsulated structure 322 includes two chips 304.

FIG. 3C shows the plurality of diced encapsulated structures 322 being held by a second holding structure 326 according to various embodiments. The method may further include holding the encapsulated structure 314 from a second main processing side 320 thereof being opposite to the first main processing side 316 by means of a second holding structure 326. Holding the encapsulated structure 314 from a second main processing side 320 thereof being opposite to the first main processing side 316 by means of the second holding structure 326 may include holding the encapsulated structure 314 from a second main processing side 320 thereof being opposite to the first main processing 316 by means of a second holding structure 326 after dicing (to form the diced encapsulated structures 322). Holding the encapsulated structure 314 may include holding one or more diced encapsulated structures 322. The method may further include removing the first holding structure 318. The first holding structure 318 may be removed while the encapsulated structure 314 (or one or more diced encapsulated structures 322) is held by means of the second holding structure 326. The second holding structure 326 may include a dicing foil. The dicing foil may include any of a sawing foil, a polymer foil (e.g. a plastic foil) or an adhesive layer (e.g. a double-sided adhesive tape). The thickness of the adhesive layer may be in the range from about 10 µm to about 100 µm, e.g. from about 20 µm to about 60 µm. The thickness of the polymer foil may be in the range from about 50 µm to about 200 µm, e.g. from about 80 µm to about 150 µm, e.g. about 100 µm. In various embodiments, the second holding structure 326 may be adhered to the encapsulation material 308 and the metallic carrier 302.

FIG. 3D shows the encapsulated structure 314 with an electrically conductive shielding structure 310 over at least a portion of the encapsulation material 308 according to various embodiments. The electrically conductive shielding structure 310 may be formed over at least a portion of the encapsulation material 308 to electrically connect the metallic carrier 302. In various embodiments, the electrically conductive shielding structure 310 over at least a portion of the encapsulation material 308 may be formed while the encapsulated structure 314 is held by means of the second holding structure 326. The electrical conductive shielding structure 310 may be formed over a first mains surface of the encapsulation material and a first side wall of the encapsulation material 308. The first main surface may be the first main processing side 316. The electrically conductive shielding structure 310 may be formed over the drilled holes. Alternatively, the conductive shielding structure 310 may be formed over the diced trenches. In various embodiments, the electrical conductive shielding structure 310 may include any of sputtering, spraying, evaporation, plasma deposition or other deposition technologies. In various embodiments, the conductive pads adjoining the first side wall of the encapsulation material 308 of the plurality of conductive pads 342 may be electrically connected with the electrically conductive shielding structure 310. The conductive pads adjoining the first side wall of the encapsulation material 308 of the plurality of conductive pads 342 may be electrically connected with the electrically conductive shielding structure 310 in one step.

FIG. 3E shows the encapsulated structure 314 (or diced encapsulated structures 322) being diced according to various embodiments. FIG. 3F shows a plurality of diced chip arrangements 328 being held by means of the second holding structure 326 according to various embodiments. FIG. 3G shows a plurality of separated diced chip arrangements 328 according to various embodiments. The method may further include dicing the encapsulated structure to form a plurality of diced chip arrangements 328. Dicing may include any of cutting, sawing, and/or blade dicing. Blade dicing made by carried out using a blade 330. The method may further include removing the second holding structure 326. Removing the second holding structure 326 may include removing the second holding structure 326 after the plurality of chip arrangements 328 are formed.

Subsequent dicing of encapsulated structure 314 may be required, such as when the dicing arrangements 328 are difficult to separate out due to the dicing arrangements 328 being held by the electrically conductive shielding structure 310. The method may include holding the encapsulated structure 314 from the first main processing side by means of a third holding structure. The second holding structure 326 may be removed. The second holding structure 326 may be removed while the encapsulated structure 314 is held by means of the third holding structure. The method may further including dicing the encapsulated structure 314 to form a plurality of diced chip arrangements 328 held by means of a third holding structure. The third holding structure may include a dicing foil.

In an alternative method, the encapsulated structure may be held from the second main processing side by means of a first holding structure. FIG. 4, which includes FIGS. 4A to 4D, shows a schematic 400 of a method for manufacturing a chip arrangement according to various embodiments.

Figure 4A:
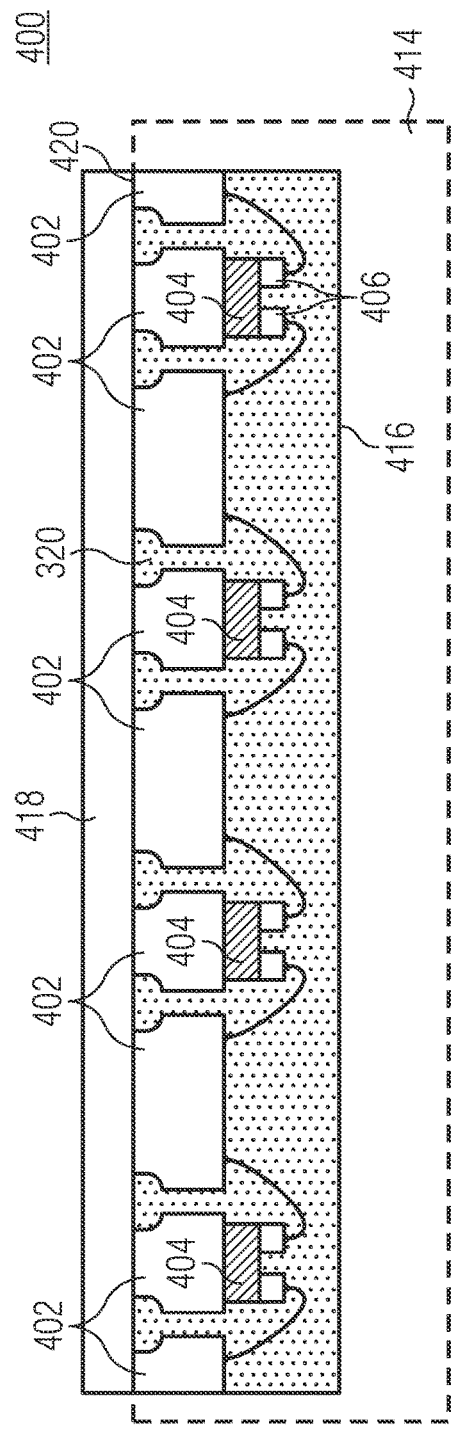

FIG. 4A shows an encapsulated structure 414 held from a second main processing side 420 by means of a first holding structure 418 according to various embodiments. The first holding structure 418 may include a dicing foil. The first holding structure 418 may be adhered to the encapsulation material 408.

In various embodiments, a plurality of chips 404 may be arranged on a metallic carrier 402. The metallic carrier 402 may be a leadframe. Each chip may include a chip contact 406. Each chip contact 406 may be electrically coupled to the metallic carrier 402. Each chip contact 406 may be electrically coupled to the metallic carrier 402, e.g. directly coupled or via a wire bond 412. Arranging the plurality of chips 404 onto the metallic carrier 402 may include bonding. Arranging the plurality of chips 404 onto the metallic carrier 402 may include a solder process. Arranging the plurality of chips 404 onto the metallic carrier 402 may include using an adhesive. The method may further include at least partially encapsulating the plurality of chips 404 with encapsulation material 408 to form an encapsulated structure 414.

Figure 4B:
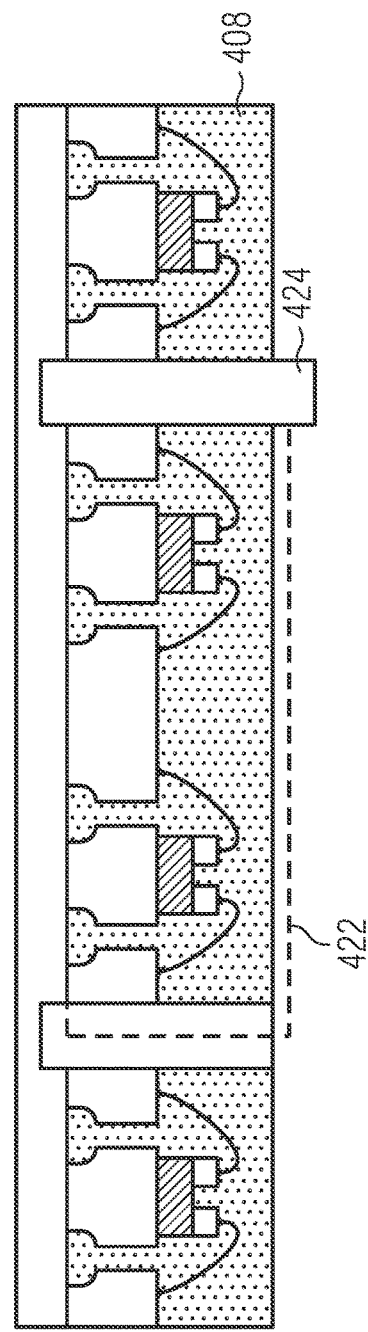

FIG. 4B shows the encapsulated structure 414 being diced to form a plurality of diced encapsulated structures 422 according to various embodiments. The method may further include dicing the encapsulated structure 414 to form a plurality of diced encapsulated structures 422 held by means of the first holding structure 418. Dicing may include any of cutting, sawing, drilling (e.g. laser or mechanical) and/or blade dicing. Blade dicing made by carried out using a blade 424. Dice trenches separating each of the diced encapsulated structures 422 from one another may be formed by dicing. A plurality of holes may also be drilled (using, for instance, laser or mechanical drilling) into the encapsulated structure 414. A plurality of holes may be formed through the encapsulation material 408 to expose at least a portion of the metallic carrier 402. Forming a plurality of diced encapsulated structures 422 includes drilling a plurality of holes to form the plurality of diced encapsulated structures 422. In various embodiments, each diced encapsulated structure 422 includes two chips 404.

Figure 4C:
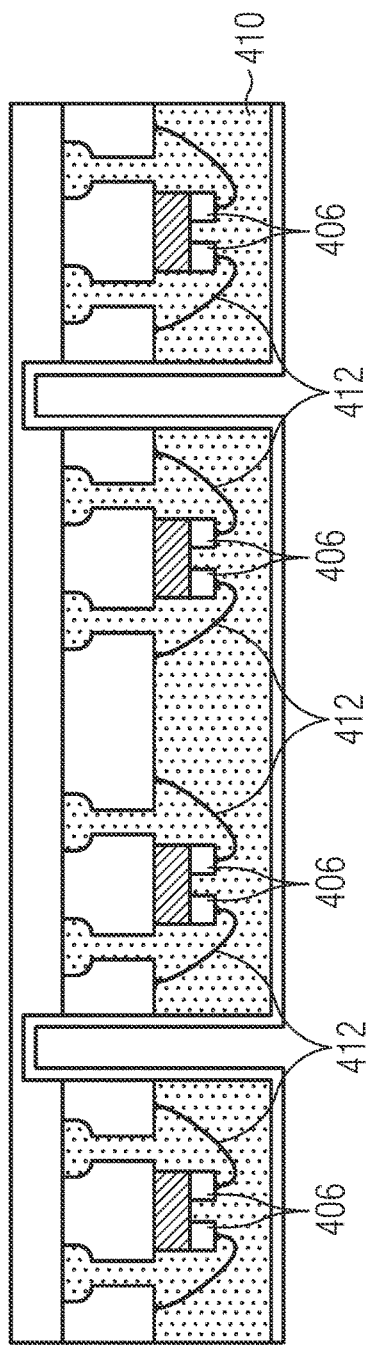

FIG. 4C shows the encapsulated structure 414 (or a plurality of diced encapsulated structures 422) with an electrically conductive shielding structure 410 over at least a portion of the encapsulation material 408 according to various embodiments. After dicing the encapsulated structure to form a plurality of diced encapsulated structures 422, the method may further include forming an electrically conductive shielding structure 410 over at least a portion of the encapsulated material 408 to electrically contact the metallic carrier 418. In various embodiments, the electrically conductive shielding structure 410 over at least a portion of the encapsulation material 408 may be formed while the encapsulated structure 414 is held by means of the first holding structure 418. The electrical conductive shielding structure 410 may be formed over a first mains surface of the encapsulation material and a first side wall of the encapsulation material 408. The first mains surface may be the first main processing side 416. The electrically conductive shielding structure 410 may be formed over the drilled holes. Alternatively, the conductive shielding structure 410 may be formed over the diced trenches. In various embodiments, the electrical conductive shielding structure 410 may include any of sputtering, spraying, evaporation, plasma deposition or other deposition technologies. In various embodiments, the conductive pads adjoining the first side wall of the encapsulation material 408 of the plurality of conductive pads 442 may be electrically connected with the electrically conductive shielding structure 410. The conductive pads adjoining the first side wall of the encapsulation material 408 of the plurality of conductive pads 442 may be electrically connected with the electrically conductive shielding structure 410 in one step.

Figure 4D:
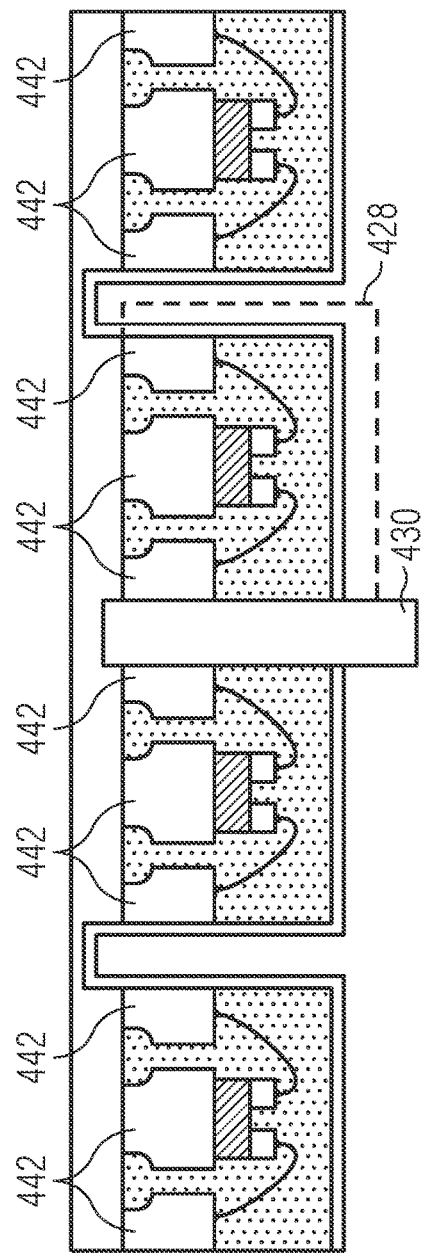

FIG. 4D shows the encapsulated structure 414 (or diced encapsulated structures 422) being diced according to various embodiments. The method may further include dicing the encapsulated structure to form a plurality of diced chip arrangements 428. Dicing may include any of cutting, sawing, and/or blade dicing. Blade dicing made by carried out using a blade 430. The method may further include after forming the plurality of diced chip arrangements 428, removing the first holding structure 418.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip arrangement, comprising:
   a metallic carrier;
   at least one chip arranged on the metallic carrier, wherein the at least one chip comprises a chip contact, wherein the chip contact is electrically coupled to the metallic carrier;
   encapsulation material at least partially encapsulating the at least one chip; and
   an electrically conductive shielding structure formed over at least a portion of the encapsulation material to electrically contact the metallic carrier;
   wherein the electrically conductive shielding structure is formed over a first main surface of the encapsulation material, a first sidewall of the encapsulation material and a sidewall of the metallic carrier, the first sidewall of the encapsulating material and the sidewall of the metallic carrier being in the same plane;

wherein a second sidewall of the encapsulation material, which is opposite the first sidewall of the encapsulation material is substantially free of the electrically conductive shielding structure;

wherein the electrically conductive shielding structure is configured to shield the at least one chip from electromagnetic radiation.

2. The chip arrangement of claim 1, wherein the metallic carrier is configured to provide a reference potential.

3. The chip arrangement of claim 1, wherein the chip contact is electrically coupled to the metallic carrier via a wire bond.

4. The chip arrangement of claim 1, wherein the electrically conductive shielding structure is formed to electrically contact the metallic carrier at the first sidewall of the encapsulation material.

5. The chip arrangement of claim 1, configured as a leadless package.

6. The chip arrangement of claim 1, wherein at least one hole is formed through the encapsulation material to expose at least a portion of the metallic carrier;
wherein the electrically conductive shielding structure is formed over at least a portion of a sidewall of the hole through the encapsulation material to electrically contact the exposed portion of the metallic carrier.

7. The chip arrangement of claim 1, the chip further comprising: a first surface and a second surface opposite the first surface; wherein the chip contact is electrically coupled to the metallic carrier at the second surface; and
wherein electrically conductive shielding structure formed over the first main surface of the encapsulation material is disposed such that the first surface of the chip faces the electrically conductive shielding.

8. The chip arrangement of claim 1, wherein the electrically conductive shielding structure is formed over an exterior sidewall of the metallic carrier.

9. A chip arrangement, comprising:
a metallic carrier;
at least one chip arranged on the metallic carrier, wherein the at least one chip comprises a chip contact, wherein the chip contact is electrically coupled to the metallic carrier;
encapsulation material at least partially encapsulating the at least one chip, wherein at least a portion of the metallic carrier is free from the encapsulation material; and
an electrically conductive shielding structure formed over at least a portion of the encapsulation material to electrically contact the metallic carrier via the portion of the metallic carrier which is free from the encapsulation material,
wherein the portion of the metallic carrier which is free from the encapsulation material forms a portion of a sidewall of the chip arrangement; and
wherein the electrically conductive shielding structure is formed over a first main surface of the encapsulation material, a first sidewall of the encapsulation material and a sidewall of the metallic carrier, the first sidewall of the encapsulating material and the sidewall of the metallic carrier being in the same plane,
wherein a second sidewall of the encapsulation material, which is opposite the first sidewall of the encapsulation material is substantially free of the electrically conductive shielding structure,
wherein the electrically conductive shielding structure is configured to shield the at least one chip from electromagnetic radiation.

10. The chip arrangement of claim 9, wherein the metallic carrier is configured to provide a reference potential.

11. The chip arrangement of claim 9, wherein the chip contact is electrically coupled to the metallic carrier via a wire bond.

12. The chip arrangement of claim 9, wherein at least one hole is formed through the encapsulation material to expose at least a portion of the metallic carrier;
wherein the electrically conductive shielding structure is formed over at least a portion of a sidewall of the hole through the encapsulation material to electrically contact the exposed portion of the metallic carrier.

13. A method for manufacturing a chip arrangement, the method comprising:
arranging at least one chip on a metallic carrier, wherein the at least one chip comprises a chip contact;
electrically coupling the chip contact to the metallic carrier;
at least partially encapsulating the at least one chip with encapsulation material; and
forming an electrically conductive shielding structure over at least a portion of the encapsulation material to electrically contact the metallic carrier,
wherein the electrically conductive shielding structure is formed over a first main surface of the encapsulation material, a first sidewall of the encapsulation material and a sidewall of the metallic carrier, the first sidewall of the encapsulating material and the sidewall of the metallic carrier being in the same plane,
wherein a second sidewall of the encapsulation material, which is opposite the first sidewall of the encapsulation material is substantially free of the electrically conductive shielding structure,
wherein the electrically conductive shielding structure is configured to shield the at least one chip from electromagnetic radiation.

* * * * *